United States Patent [19]
Okuda et al.

[11] Patent Number: 5,469,459
[45] Date of Patent: Nov. 21, 1995

[54] LASER DIODE ELEMENT WITH EXCELLENT INTERMODULATION DISTORTION CHARACTERISTIC

[75] Inventors: Tetsuro Okuda; Hirohito Yamada; Toshitaka Torikai, all of Tokyo, Japan

[73] Assignee: NEC Corporation, Tokyo, Japan

[21] Appl. No.: 178,859

[22] Filed: Jan. 7, 1994

[30] Foreign Application Priority Data

Jan. 8, 1993 [JP] Japan .................................. 5-001501
Apr. 21, 1993 [JP] Japan .................................. 5-093460

[51] Int. Cl.$^6$ .................................................. H01S 3/19
[52] U.S. Cl. .................................................. 372/46; 372/50
[58] Field of Search .................................. 372/46, 50, 96, 372/102

[56] References Cited

U.S. PATENT DOCUMENTS

| | | | |
|---|---|---|---|
| 4,794,618 | 12/1988 | Mito | 372/96 |
| 5,012,484 | 5/1991 | Flynn et al. | |
| 5,170,402 | 12/1992 | Ogita et al. | 372/96 |

FOREIGN PATENT DOCUMENTS

| | | |
|---|---|---|
| 62-219684 | 9/1987 | Japan . |
| 1155677 | 6/1989 | Japan . |
| 220087 | 1/1990 | Japan . |
| 290688 | 3/1990 | Japan . |
| 3283483 | 12/1991 | Japan . |

OTHER PUBLICATIONS

IEEE Journal on Selected Areas in Communications, vol. 8, No. 7, Sep. 1990, pp. 1359–1364, A. Takemoto et al., "Distributed Feedback Laser Diode and Module for CATV Systems".

Patent Abstracts of Japan, vol. 16, No. 108, 17 Mar. 1992.

Electronic Letters, vol. 22, No. 20, 25 Sep. 1986, pp. 1047–1049, H. Soda et al., "Design of DFB Lasers for High-power Single-Mode Operation".

IEE Proceedings, Part J, voil. 133, No. 2, Apr. 1986, pp. 163–164, J. Buus, "Dynamic Single-Mode Operation of DFB Lasers with Phase Shifted Gratings and Reflection Mirrors".

Journal of Lightwave Technology, vol. 5, No. 6, Jun. 1987, pp. 848–855, H. Ishikawa et al., "Distributed Feedback Laser Emitting at 1.3 um for Gigabit Communication Systems".

IEEE Journal of Quantum Electronics, vol. 27, No. 8, Aug. 1991, pp. 1990–2002, G. Morthier et al, "Theoretical Inve-tigation of tyhe Second-Order Harmonic Distortion in the AM-Response of 1.55 um F-P and DFB Lasers".

*Primary Examiner*—Rodney B. Bovernick
*Assistant Examiner*—Robert E. Wise
*Attorney, Agent, or Firm*—Sughrue, Mion, Zinn, Macpeak & Seas

[57] ABSTRACT

In a laser diode element including a front facet, a rear facet, a laser cavity formed between the front rear facets and which has a predetermined length L, coating layers coated on the front facet to provide a reflectivity smaller than 5%, and an active layer and a uniform grating having regular corrugation formed in the direction of the layer cavity and which are coupled to each other at a predetermined coupling constant K, the laser diode element is specified by a product of the predetermined coupling constant and the predetermined length L and falling within a range between 0.4 and 1.0, both inclusive.

12 Claims, 14 Drawing Sheets

REFLECTIVITY ON A REAR SURFACE 75%

$\kappa L = 0.7$

REFLECTIVITY ON A FRONT SURFACE 1%

$\kappa L = 0.7$

LASER DIODE ELEMENT WITH EXCELLENT INTERMODULATION DISTORTION CHARACTERISTIC

BACKGROUND OF THE INVENTION

This invention relates to a laser diode element and, particularly, to a Distributed Feed Back (DFB) laser diode element.

A conventional laser diode element of the type described generally comprises a semiconductor block having a front facet, a rear facet opposite the front facet, a laser cavity formed between the front and the rear facets and having a predetermined length L, a plurality of coating layers coated on the front and the rear facets to provide a predetermined reflectively, respectively, an active layer and a grating formed in the direction of the laser cavity and coupled to each other at a predetermined coupling constant K.

Many types of the DFB laser diode elements have been developed to have good single longitudinal mode characteristics.

For example, some DFB laser diode elements were proposed in laid-open Japanese patent application No. H1-155677, H2-90688, and H2-20087. In these examples, the predetermined reflectively as well as a product of the predetermined coupling constant K and the predetermined length L in each DFB laser diode element are optimized from each point of view.

On the other hand, another DFB laser diode element has been proposed in laid-open Japanese patent application No. Sho 62-219684. As illustrated in the drawing of the laid-open paper, the DFB laser diode element includes a partial grating having a regular corrugation kept in contact with the front facet.

In the interim, a DFB laser diode element has recently been used as a light source for analog modulation in a subcarrier multiplexing optical transmission method, or the like.

When used as such a light source for the analog modulation, the DFB laser diode element is required to have a better intermodulation distortion characteristic. For example, in the field of a mobile communication system, the DFB laser diode element is desired to have a characteristic in which 3rd intermodulation distortion ($IMD_3$) is sufficiently small.

However, none of the conventional laser diode elements mentioned above has ever been fabricated for the purpose of analog modulation. Accordingly, no consideration has been given to intermodulation distortion characteristics in the conventional laser diode elements. As a result, even when the conventional laser diode elements are used as light sources for analog modulations, the yield in getting laser diode elements with sufficient intermodulation distortion characteristics is inevitably not very good.

SUMMARY OF THE INVENTION

It is therefore an object of this invention to provide a laser diode element that has an excellent intermodulation distortion characteristic, and a method of manufacturing the same.

It is another object of this invention to provide a laser diode element of the type described which can be manufactured with a good yield, and a method of manufacturing such a laser diode element.

According to an aspect of this invention, there is provided a laser diode element comprising a semiconductor block having: a first end surface; a second end surface opposite to the first end surface; a laser cavity of predetermined length L formed between the first and the second end surfaces; a plurality of coating layers coated on the first end surface to provide a reflectivity smaller than 5%; and an active layer and a uniform grating that are formed in the direction of the laser cavity and coupled to each other at a predetermined coupling constant K. The laser diode element is specified by the product of the predetermined coupling constant K and the predetermined length L.

The product of the predetermined coupling constant K and the predetermined length L may range between 0.4 and 1.0, both inclusive, and preferably ranges between 0.5 and 0.7, both inclusive.

The reflectivity may be not greater than 1%.

The laser diode element may further comprise a plurality of additional coating layers that are coated on the second end surface to provide a reflectivity not smaller than 50%.

The reflectivity provided by the additional coating layers may be preferably not smaller than 90%.

According to another aspect of this invention, there is provided a laser diode element comprising a semiconductor block having: a first end surface; a second end surface opposite to the first end surface; a laser cavity of predetermined length L formed between the first and the second end surfaces; an active layer and a partial grating that are formed in the direction of the laser cavity and that are coupled to each other at a predetermined coupling constant K. The partial grating is nearer to one of the end surfaces than to the other, and is remote from the nearer surface to divide the direction of the laser cavity into a short length side and a long length side with the partial grating interposed therebetween.

According to still another aspect of this invention, there is provided a method of manufacturing a laser diode element comprising the steps of: uniformly coating a photoresist layer onto a semiconductor substrate; partially forming a grating pattern on the photoresist layer by holographic lithography method; selectively emitting light onto an area in which a grating is not formed to make the area exposed; etching the semiconductor substrate with the grating pattern operable as an etching mask to form the grating; forming a guiding layer to make the grating buried therein; growing an active layer on the guiding layer; and forming a clad layer on the active layer.

DESCRIPTION OF THE PREFERRED EMBODIMENT

Prior to descriptions of several embodiments, the principle of the present invention will first be described for a better understanding of the present invention.

During the process of creating the present invention, the inventors of the present invention experimentally fabricated many DFB laser diode elements having a uniform grating, to investigate characteristics thereof by changing some parameters in each DFB laser diode element.

Figure 1:
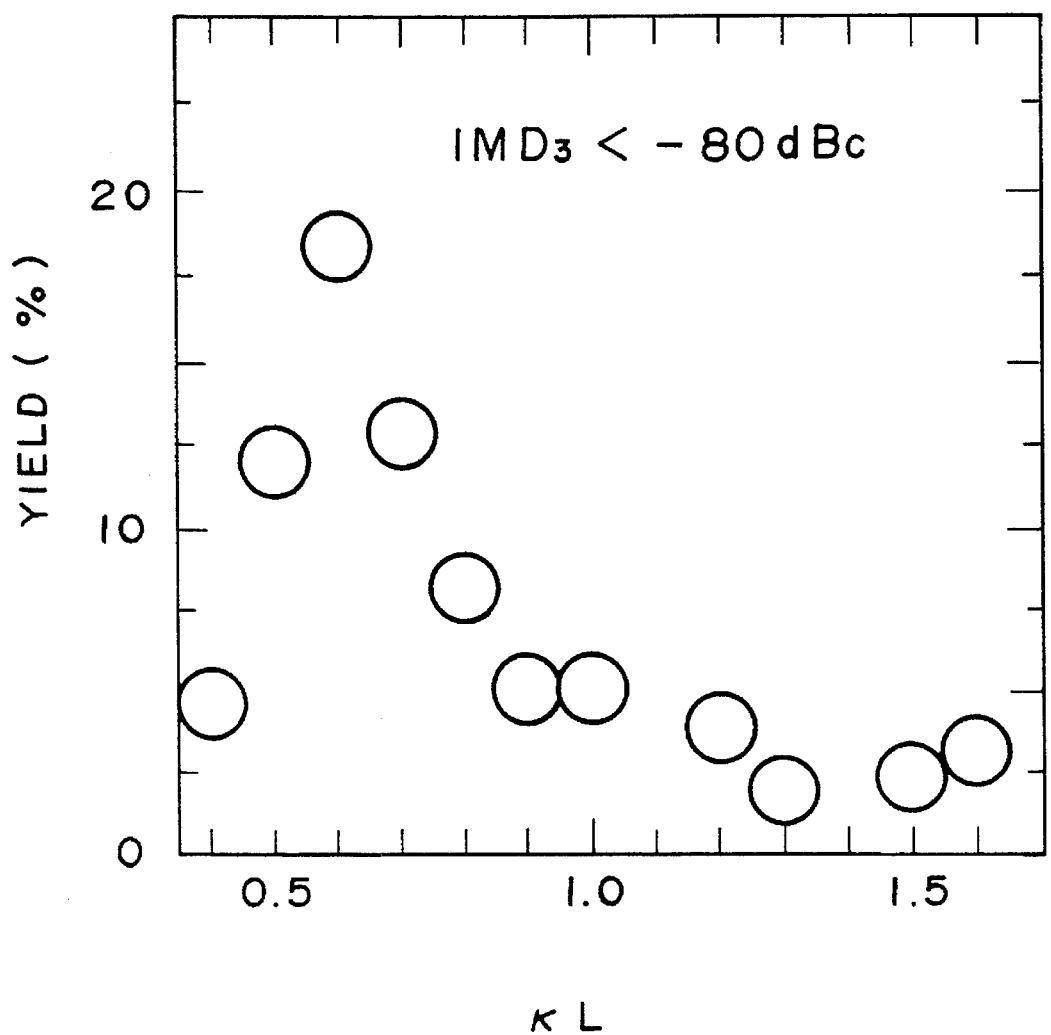
FIG. 1 shows a graphical representation for use in describing a relationship between yield and KL in several examples according to the present invention.

Referring to FIGS. 1 to 3, description is made about results of the inventors' experimental studies.

In FIG. 1, yield is plotted with respect to the product of coupling constant K and length L of the laser cavity in the DFB laser diode elements, each of which has a uniform grating. In each DFB laser diode element, reflectivity of a front surface is adjusted to 1% while reflectivity of a rear surface is adjusted to 75%. Herein, the yield is defined as the percentage of DFB laser diode elements in which the above-mentioned $IMD_3$ is not larger than −80 dBc on conditions that normalized resonator loss is not smaller than 0.05, average light output power is 8 mW, and the optical modulation index is 20%. The value of $IMD_3$ in each DFB laser diode element is accounted by the use of linearity of I-L characteristics of the DFB laser diode element. The linearity of I-L characteristics is determined by considering electrical field distribution along the laser cavity in each DFB laser diode element.

As exemplified in FIG. 1, the yield can be improved to exceed 5% when the laser diode elements are specified so that the product KL of the coupling constant K and the length L of the laser cavity falls within a range between 0.4 and 1.0, both inclusive. The yield can be further improved to exceed 10% when the product KL falls within a range between 0.5 and 0.7, both inclusive.

Figure 2A:
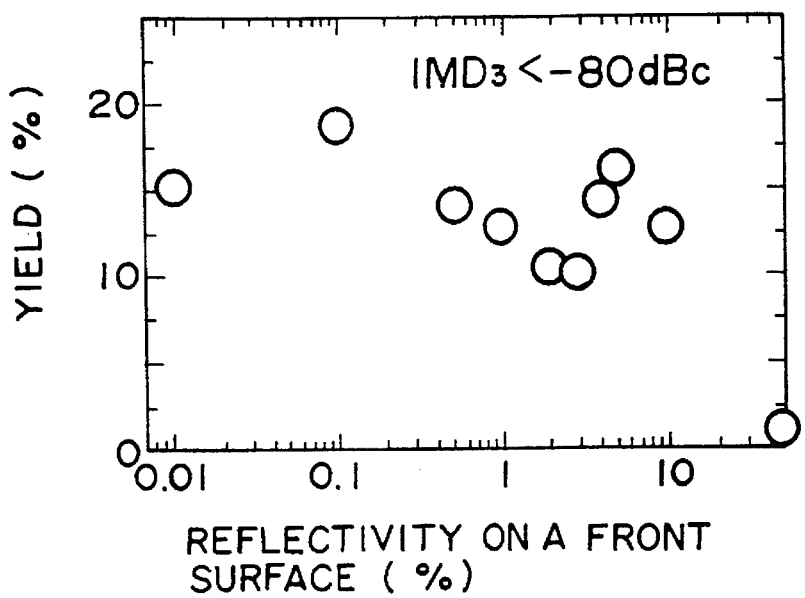
FIG. 2(a) shows a graphical representation for use in describing a relationship between yield and reflectivity of a front surface in several examples according to the present invention.

In FIGS. 2(a) and (b), yield is plotted with respect to reflectivities of front and rear surfaces in DFB laser diode elements similar to those mentioned with respect to FIG. 1. As in FIG. 1, the yield is defined to be the percentage of DFB laser diode elements in which a value of the abovementioned $IMD_3$ is not larger than −80 dBc, with conditions similar to those mentioned with respect to FIG. 1.

In FIG. 2(a), yield is plotted with respect to reflectivity of a front surface in the DFB laser diode elements. In each DFB laser diode element, the product KL is arranged to be 0.7 and reflectivity of a rear surface is adjusted to be 75%.

As exemplified in FIG. 2(a), the yield can be improved to be at least not less than 10% when the reflectivity of the front surface in each laser diode element is made smaller than 5%. The yield can be further improved to be at least not less than 12% when the reflectivity of the front surface is made not greater than 1%.

Figure 2B:
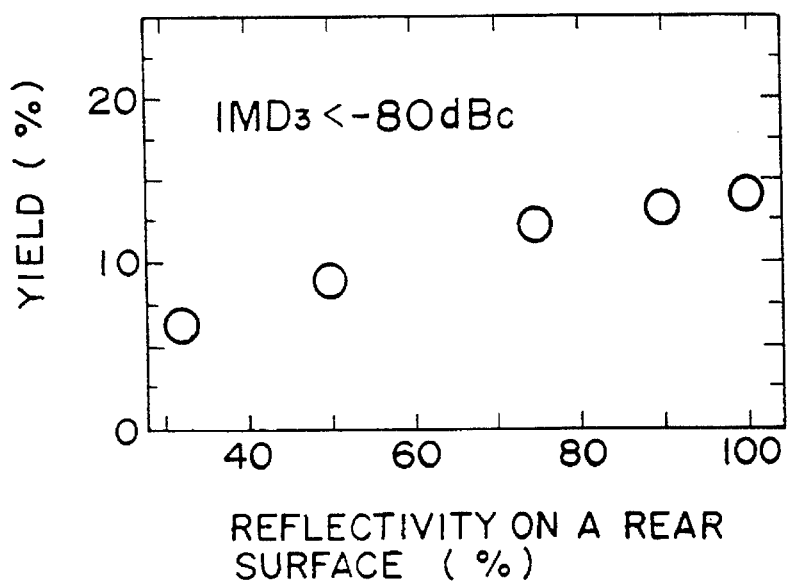
FIG. 2(b) shows a graphical representation for use in describing a relationship between yield and reflectivity of a rear surface in several examples according to the present invention.

On the other hand, yield plotted with respect to reflectivity of a rear surface in the DFB laser diode elements is shown in FIG. 2(b). In each DFB laser diode element, the product KL is arranged to be 0.7 and reflectivity of a front surface is adjusted to be 1%.

As exemplified in FIG. 2(b), the yield can be improved to exceed 10% when the reflectivity of the rear surface in each laser diode element is made to be not smaller than approximately 50%.

Figure 3A:
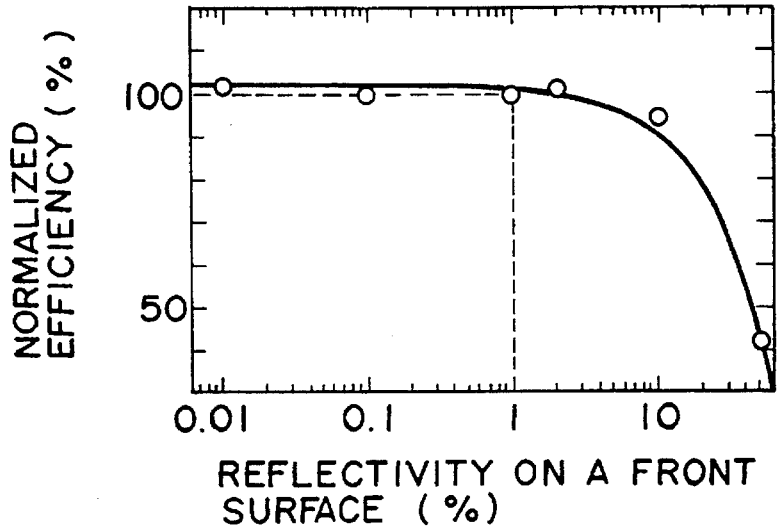
FIG. 3(a) shows a graphical representation for use in describing a relationship between normalized efficiency and reflectivity of a front surface in several examples according to the present invention.

In FIGS. 3(a) and (b), normalized efficiency is plotted with respect to reflectivities of front and rear surfaces in the experimentally fabricated DFB laser diode elements, in each of which the product KL is arranged to be 0.7.

In FIG. 3(a), normalized efficiency is plotted with respect to reflectivity of the front surface. As indicated by broken lines in FIG. 3(a), an average efficiency in the DFB laser diode elements is normalized by the average efficiency when the reflectivity of the front surface is adjusted to 1%.

As exemplified in FIG. 3(a), the normalized efficiency is stable when the reflectivity of the front surface is not greater than 1%. It is also exemplified in FIG. 3(a) that the normalized efficiency gradually deteriorates when the reflectivity of the front surface exceeds 1%.

Figure 3B:
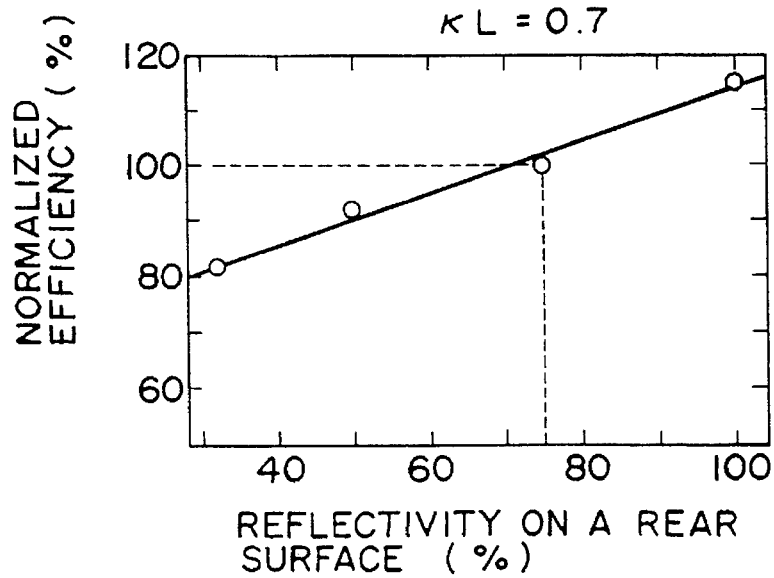
FIG. 3(b) shows a graphical representation for use in describing a relationship between normalized efficiency and reflectivity of a rear surface in several examples according to the present invention.

On the other hand, normalized efficiency is plotted with respect to reflectivity of the rear surface is shown in FIG. 3(b). As indicated by broken lines in FIG. 3(b), an average efficiency in the DFB laser diode elements is normalized by the average efficiency when the reflectivity of the rear surface is adjusted to 75%.

As exemplified in FIG. 3(b), the normalized efficiency rises linearly as the reflectivity of the rear surface becomes great. It is therefore concluded in FIG. 3(b) that the normalized efficiency is further improved when the reflectivity of the rear surface is made not smaller than 90%, and that the normalized efficiency is maximized when the reflectivity of the rear surface is made 100%. The reflectivity of the rear surface should not exceed 98% when monitoring of the light output through the rear surface is desired.

Figure 4A:
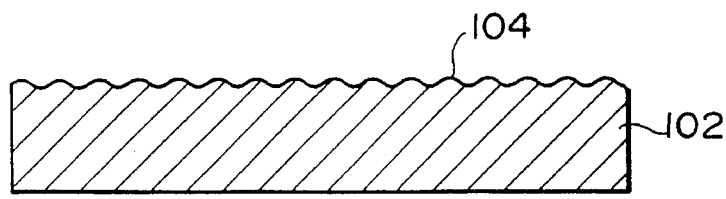
FIGS. 4(a) through (d) show in schematic vertical sections a laser diode element during progress of a method of manufacturing the laser diode element according to the first embodiment of the present invention.
Figure 4B:
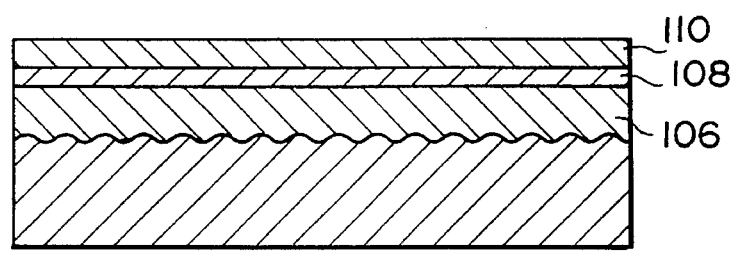
Figure 4C:
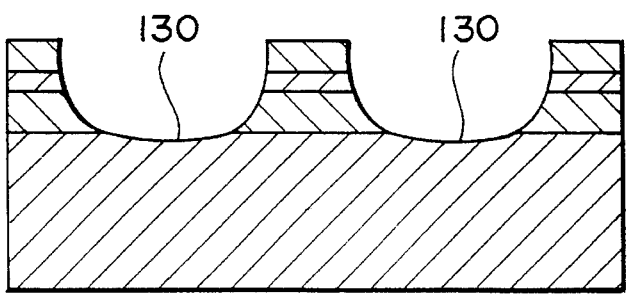
Figure 4D:
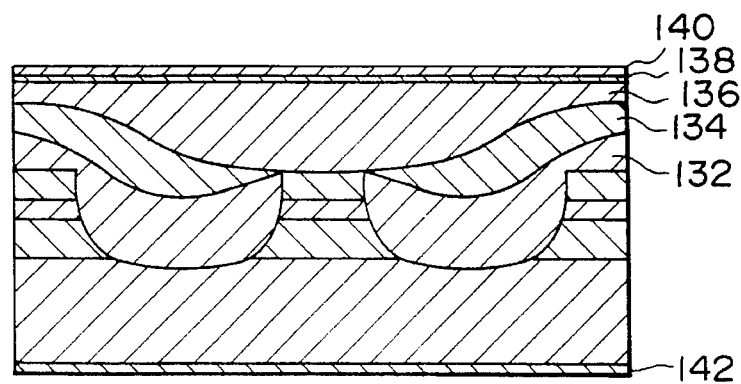
Figure 5:
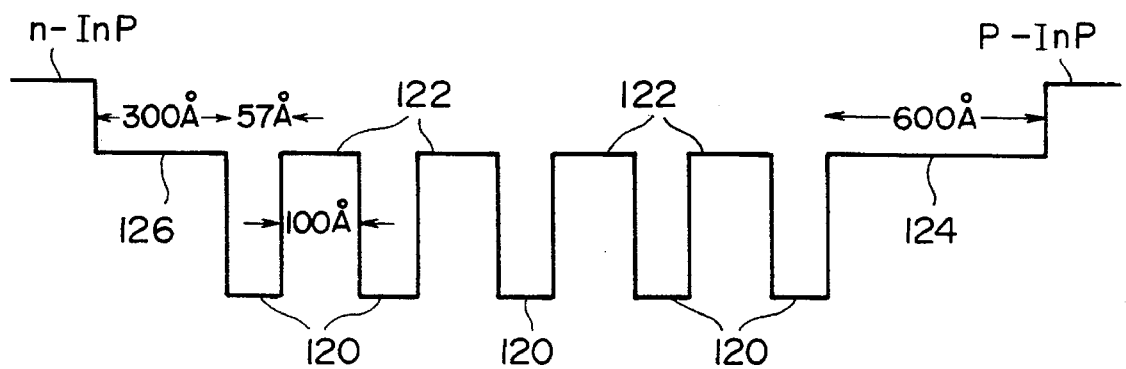
FIG. 5 shows a band diagram of active layers of the laser diode element according to the first embodiment of the present invention.

Referring now to FIGS. 4 and 5, a method of manufacturing a laser diode element according to a first embodiment of this invention is described.

As illustrated in FIG. 4(a), a substrate 102 is at first prepared in a known manner. The substrate 102 is made of InP and has a conductivity type n.

Next, a uniform grating 104 having a regular corrugation with a period of 2025 angstroms and a depth of 250 angstroms is formed on the substrate by a holographic lithography method.

Third, as illustrated in FIG. 4(b), a light guiding layer 106 of InGaAsP having a conductivity type n is grown on the uniform grating 104 by a Metal Organic Vapor Phase Epitaxy (MOVPE) method to have a thickness of 1000 angstroms. Active layers of Multi Quantum Well (MQW) 108 are then grown on the light guiding layer 106 by the MOVPE method to have a thickness of approximately 0.5 micron. Thereafter, a clad layer 110 of InP having a conductivity type p is grown on the active layers by the MOVPE method to have a thickness of approximately 0.5 micron.

Referring to FIG. 5, the active layers of MQW include wells 120 and barriers 122. The wells have a composition defined by a bandgap corresponding to a wavelength of 1.40 microns. On the other hand, the barriers 122 have a composition defined by a bandgap corresponding to a wavelength of 1.13 microns. Specifically, the wells 120 are equal in number to five. Each well is provided by a film having a thickness of 57 angstroms, while each barrier is also provided by a film having a thickness of 100 angstroms. The wells 120 and the barriers 122 are interposed on both sides between SCH layers 124 and 126 each of which has a composition defined by a bandgap corresponding to a wavelength of 1.13 microns. As illustrated in FIG. 5, the SCH layer 124 is adjacent to a p-InP layer and has a thickness of 600 angstroms, while the SCH layer 126 is adjacent to an n-INP layer and has a thickness of 300 angstroms.

After growth of the active layers of MQW 108, a positive photoresist (not shown) is coated on the MQW active layers 108. Photolithography and etching are then carried out in a known manner to form stripe-shaped grooves 130, as illustrated in FIG. 4(c).

Thereafter, p-InP electric current blocking layer 132, n-InP electric current blocking layer 134, p-Inp clad layer 136, and p-InGaAsP cap layer 138 are formed one-by-one by Liquid Phase Epitaxy (LPE) to form a double-channel planar buried hereto (DC-PBH) structure.

Further, electrode layers 140 and 142 are evaporated onto both surfaces of the DC-PBH structure. The DC-PBH structure is cleaved at a predetermined portion. The coating layers (not shown) are coated on a rear facet (not shown) to provide a reflectivity of 75%, while the additional coating layers (not shown) are coated on a front facet to provide a reflectivity of 1%. Each layer is composed of SiN. Thereafter, the cleaved DC-PBH wafer is scribed or cut along the width direction into a plurality of laser diode elements.

Under these circumstances, characteristics of each of the laser diode elements were investigated and estimated. Consequently, it was found that the laser diode element oscillates with a wavelength of 1.31 microns, and that the efficiency is about 0.4 W/A. It was also found that the value of KL is about 0.9.

In order to estimate intermodulation distortion characteristics of the laser diode element, the laser diode element was assembled into a module so that $IMD_3$ of the laser diode element could be measured. As a result, the above-mentioned $IMD_3$ was found to be smaller than −85 dBc under conditions such that the average light output power is 4 mW and the optical modulation index is 20%.

Thus, it has been confirmed that the laser diode element has excellent intermodulation distortion characteristics.

In this case, yield, defined to be the percentage of laser diode elements in which a value of the above-mentioned $IMD_3$ is smaller than −85 dBc, was about 4% among all of the laser diode elements.

In order to improve the yield, the inventors also fabricated other laser diode elements, each having a uniform grating of regular corrugation to a depth of 200 angstroms. Characteristics of each of these other laser diode elements were investigated and estimated. Consequently, it was found that the value of KL was about 0.7 and the yield, as defined above, was about 12% among all of these other laser diode elements.

Further, the inventors fabricated still other laser diode elements, each with coating layers on its front facet having a reflectivity of 0.1%. For these, the yield was further improved to about 16%.

Furthermore, the inventors fabricated yet other laser diode elements, each with coating layers on its rear facet having a reflectivity of 90%. For these, efficiency was improved to about 0.43 W/A.

Thus, laser diode elements having excellent intermodulation distortion characteristics can be manufactured with a good yield.

Figure 6:
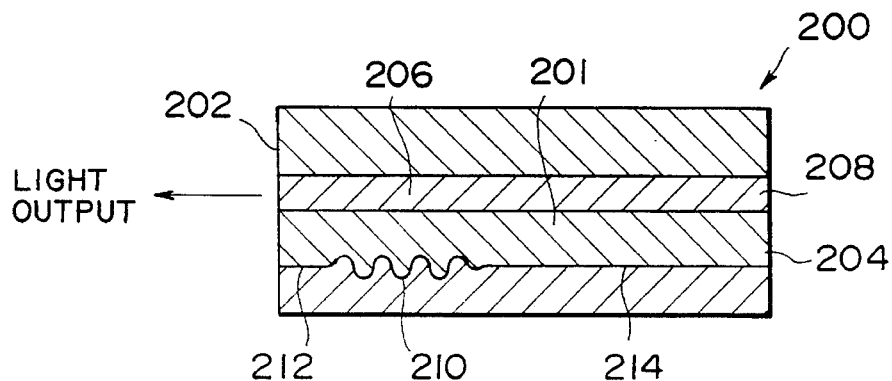
FIG. 6 schematically shows in vertical section a side view of a laser diode element according to the second embodiment of the present invention.

Referring to FIG. 6, a laser diode element according to the second embodiment of the present invention is now described.

As illustrated in FIG. 6, the laser diode element 200 comprises a semiconductor block 201 having a front facet 202, a rear facet 204 opposite to the front facet 202, a laser cavity 206 which is formed between the front and the rear facets 202 and 204 and which has a predetermined length L, an active layer 208 and a partial grating 210 having regular corrugation which are formed in the direction of the laser cavity 206 and which are coupled to each other at a predetermined coupling constant K. The partial grating 210 is nearer to the front facet 202 than to the rear facet 204 and is remote from the front facet 202 to divide the direction of the laser cavity into a short length side 212 and a long length side 214 with the partial grating 210 interposed between the short and the long length sides 212 and 214.

In this embodiment, the partial grating 210 is remote from the front facet 202 and the rear facet 204, both of which are operable as cleaved surfaces. Accordingly, laser diode elements, each of which is cleaved and scribed from a wafer, become stable in their characteristics. The laser diode elements having sufficient characteristics can be manufactured with a good yield.

The front facet and the rear facet may be called a first end surface and a second end surface, respectively.

Figure 7:
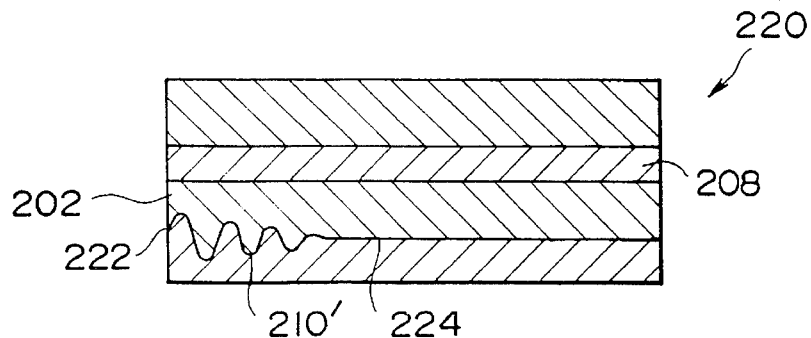
FIG. 7 schematically shows in vertical section a side view of a laser diode element according to the third embodiment of the present invention.

Referring to FIG. 7, a laser diode element 220 according to the third embodiment of this invention has a structure similar to that of the laser diode element 200 illustrated in FIG. 6, except for the following.

In this embodiment, the partial grating 210' is kept in contact with the front facet 202 to provide a contact side 222 and a non-contact side 224 with the partial grating 210' interposed therebetween and extended from the contact side 22 towards the noncontact side 224. The coupling constant K is larger at the contact side 222 than at the non-contact side 24. Thus, the coupling constant K becomes smaller with distance from the contact side 222.

Figure 8:
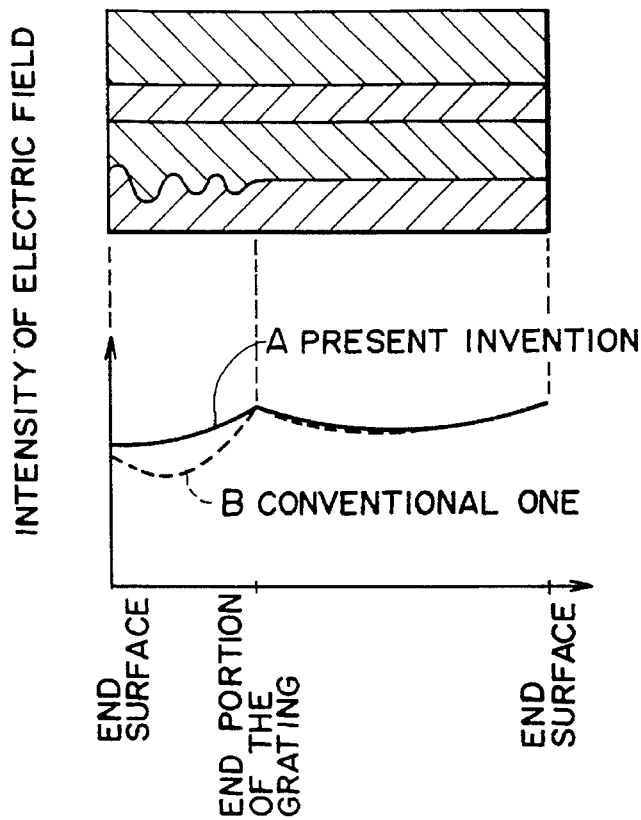
FIG. 8 shows an electrical field distribution in the direction of a laser cavity in the laser diode element illustrated in FIG. 7 in comparison with the conventional one.

Referring to FIG. 8, electrical field distribution in the direction of a laser cavity in the laser diode element 220 illustrated in FIG. 7, in comparison with the conventional one, is now described.

As depicted by continuous line A in FIG. 8, the electrical field distribution in the laser diode element 220 becomes even or uniform in the direction of the laser cavity as compared with the conventional one of which the distribution is depicted by broken line B. Linearity of I-L characteristics is therefore improved in this embodiment. As a result, intermodulation distortion is considerably decreased in this embodiment.

Figure 9:
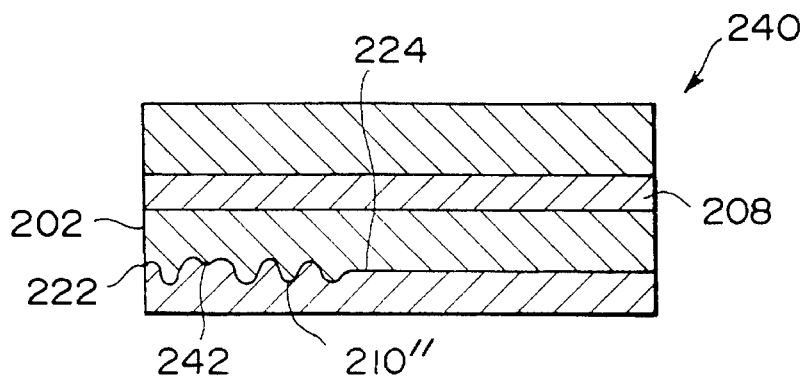
FIG. 9 schematically shows in vertical section a side view of a laser diode element according to the fourth embodiment of the present invention.

Referring to FIG. 9, a laser diode element 240 according to the fourth embodiment of this invention has a structure similar to that of the laser diode element 200 illustrated in FIG. 6 except for the following.

In this embodiment, the partial grating 210" is kept in contact with the front facet 202 to provide a contact side 222 and a non-contact side 224 with the partial grating 210" interposed therebetween and extended from the contact side 222 towards the noncontact side 224. The regular corrugation of the grating has an irregular portion 242 which is operable as a phase shift portion.

Figure 10:
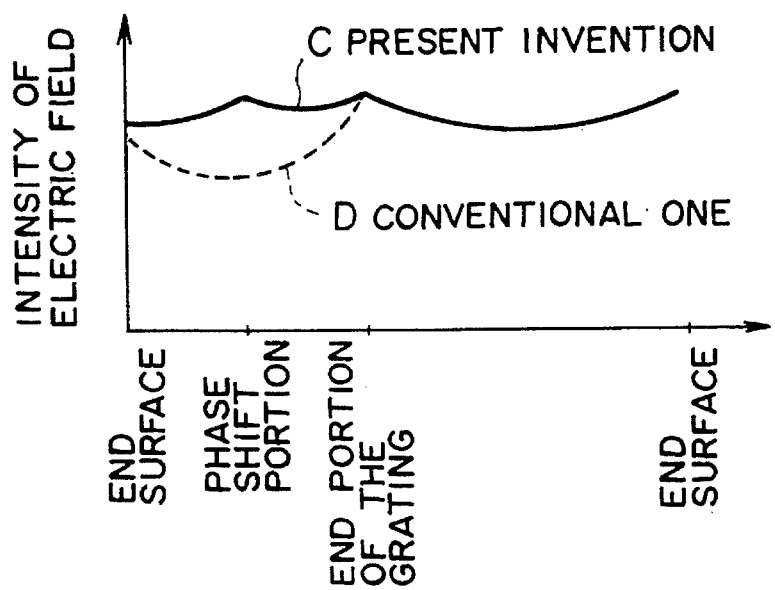
FIG. 10 shows an electrical field distribution in the direction of a laser cavity in the laser diode element illustrated in FIG. 9 in comparison with the conventional one.

Referring now to FIG. 10, electrical field distribution in the direction of a laser cavity in the laser diode element 240 illustrated in FIG. 9 in comparison with the conventional one is described.

In FIG. 10, continuous line C shows an electrical field distribution in the laser diode element 240, while broken line D shows that of the conventional laser diode element. As shown in FIG. 10, the continuous line C has a peak in the portion corresponding to the above-mentioned irregular of phase shift portion 242. As a result, the electrical field distribution in the laser diode element 240 becomes even or uniform along the laser cavity as compared with the conventional one. Alternatively, a plurality of phase shift portions may be formed in the grating. In this case, evenness or uniformity of the distribution will be further improved.

Figure 11:
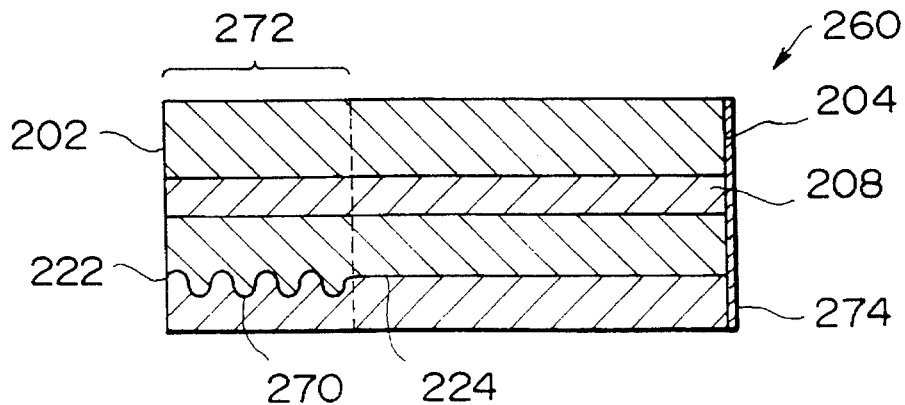
FIG. 11 schematically shows in vertical section a side view of a laser diode element according to the fifth embodiment of the present invention.

Referring to FIG. 11, a laser diode element 260 according to the fifth embodiment of this invention has a structure similar to that of the laser diode element 200 illustrated in FIG. 6 except for the following.

In this embodiment, the partial grating 270 is kept in contact with the front facet 202 to provide a contact side 222 and a non-contact side 224 with the partial grating 210 interposed therebetween and extended from the contact side 222 towards the non-contact side 224. The portion in which the partial grating 270 is formed is operable as distributed Bragg reflector region 272.

A plurality of coating layers 274 are coated on the rear facet 204 which is opposite to the distributed Bragg reflector region 272 to provide a high reflectivity. Light output is generated from the front facet 202 which is adjacent to the distributed Bragg reflector region 272.

Figure 12:
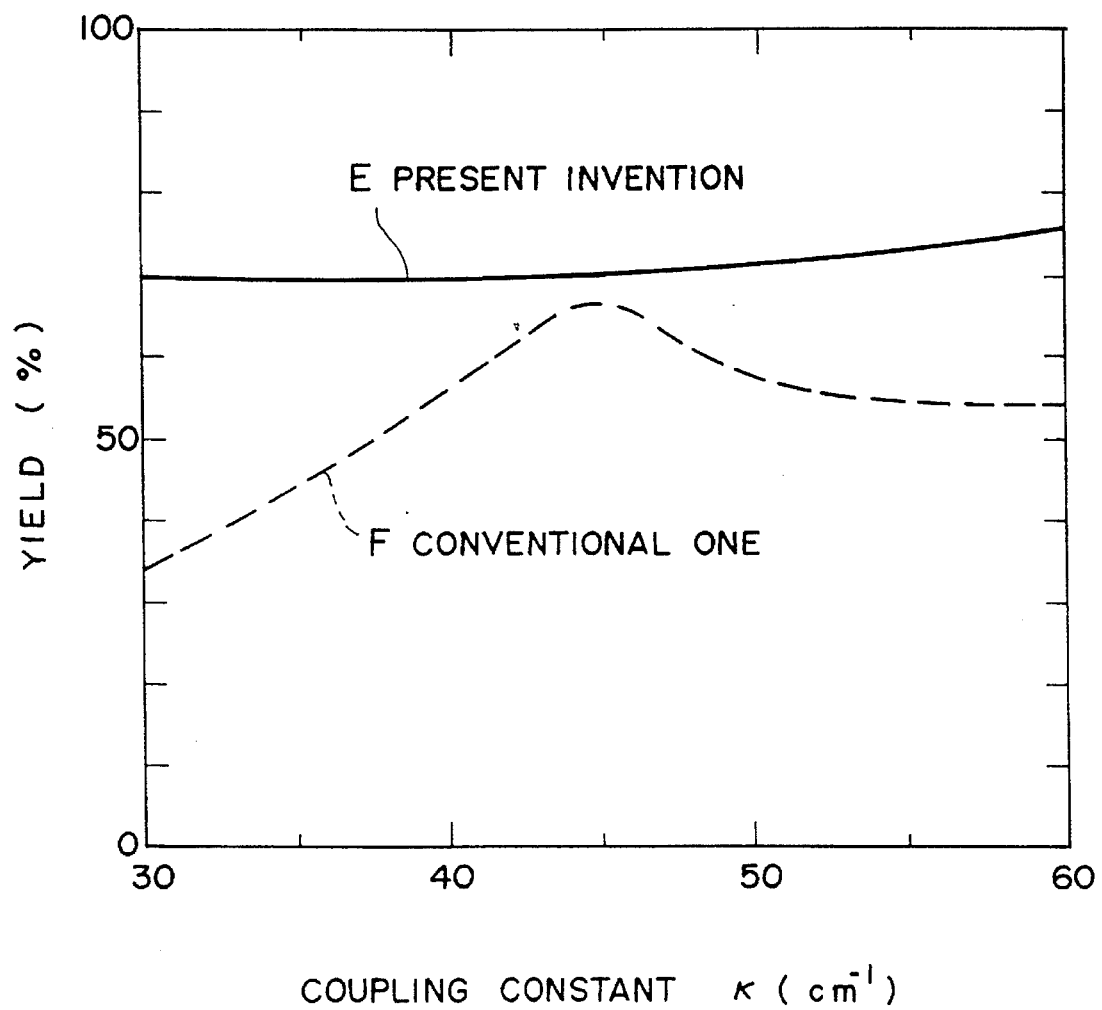
FIG. 12 shows a graphical representation for use in describing a relationship between yield and coupling constant K in the laser diode element illustrated in FIG. 11 in comparison with the conventional one.

Referring to FIG. 12, the relationship between yield and coupling constant in the laser diode element 260 illustrated in FIG. 11 is now described in comparison with the conventional one. In FIG. 12, the yield is defined as the percentage of laser diode elements in which the value of $IMD_3$ is smaller than −80 dBc.

In FIG. 12, a continuous line E shows the yield of the laser diode elements 260 while a broken line F shows that of the conventional laser diode element.

As indicated in FIG. 12, the yield of the laser diode elements 260 is stable even though the coupling constant K is changed. In other words, the yield of the laser diode elements 260 does not depend on the coupling constant K. Consequently, it becomes unnecessary to control the coupling constant K strictly.

Figure 13:
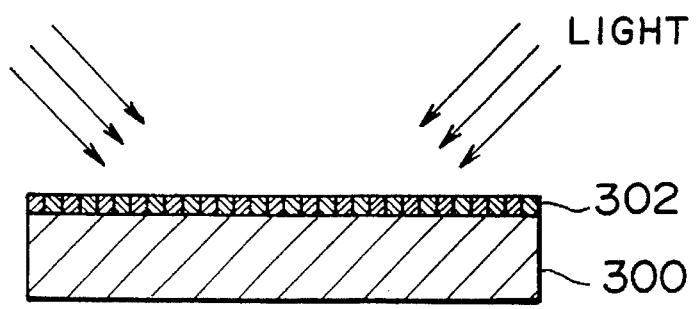
FIGS. 13(a) through (e) show in schematic vertical sections a laser diode element during progress of a method of manufacturing the laser diode element according to the second embodiment of the present invention.
Figure 13:
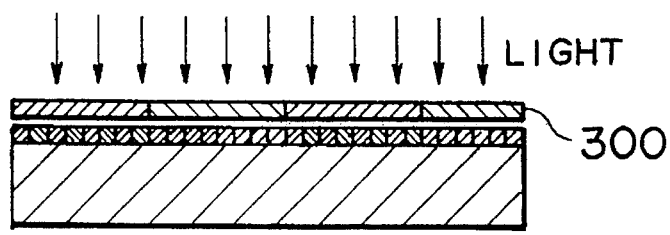
Figure 13:
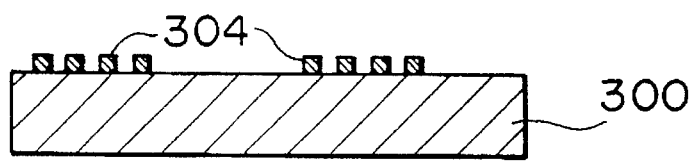
Figure 13:
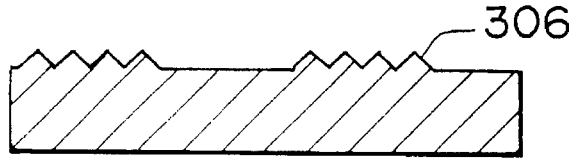
Figure 13:
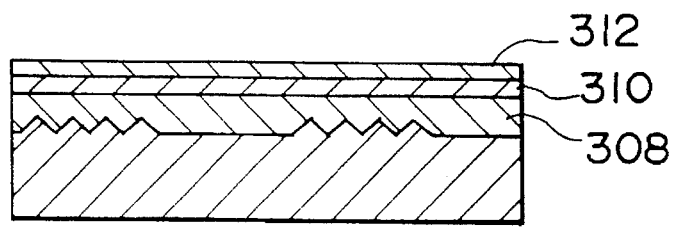

Referring now to FIGS. 13 though 15, description will proceed to a method of manufacturing the above-mentioned laser diode element according to the second embodiment of the present invention.

As shown in FIG. 13(a), a substrate 300 of n-InP is at first prepared in a known manner. A photoresist 302 is then coated on the substrate 300. The photoresist 302 is exposed by a holographic lithography method to be patterned with a period of 2025 angstroms.

Second, as illustrated in FIG. 13(b), the substrate 300 and the patterned photoresist 302 are closely exposed by the use of a mask 303 having a predetermined mask pattern. In this event, an area in which a grating should not be formed is selectively permitted to be exposed. After being developed, a predetermined pattern 304 is formed on the substrate 300 for partially making the grating, as illustrated in FIG. 13(c). The substrate 300 is etched to form a partial grating 306 having a depth of 400 angstroms by using the predetermined pattern 304 as an etching mask. In this case, a coupling constant in the partial grating 306 is 40 $cm^{-1}$.

Third, a light guiding layer 308 of n-InGaAsP is grown on the partial grating 306 and the substrate 300 by the aforesaid MOVPE method to have a thickness of 1000 angstroms. An active layer 310 of MQW structure is then stacked on the light guiding layer 308 by the same method to have a thickness of about 0.5 micron. Thereafter, a clad layer 312 of p-InP is formed on the active layer 310 by the same method to have a thickness of approximately 0.5 micron.

Figure 14:
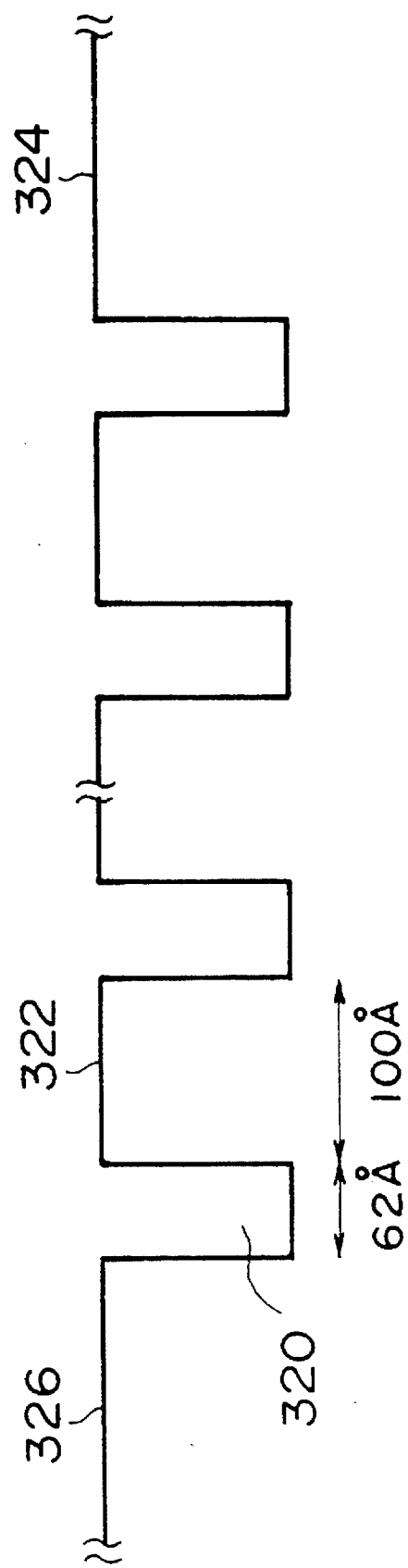
FIG. 14 shows a band diagram of active layers of a laser diode element according to the second embodiment of the present invention.

Referring to FIG. 14, the active layer 310 of MQW structure includes wells 320 and barriers 322. The wells 320 have a composition defined by a bandgap corresponding to a wavelength to 1.40 microns. On the other hand, the barriers 322 have a composition defined by a bandgap corresponding to a wavelength of 1.13 microns. Specifically, the wells 320 are equal in number to ten. Each well is provided by a film having a thickness of 62 angstroms, while each barrier is also provided by a film having a thickness of 100 angstroms. The wells 320 and the barriers 322 are interposed on both sides between SCH layers 324 and 326 each of which has a composition defined by a bandgap corresponding to a wavelength of 1.13 microns. Although it is not shown in FIG. 14, the SCH layer 324 is adjacent to a p-InP layer and has a thickness of 600 angstroms, while the SCH layer 326 is adjacent to an n-InP layer and has a thickness of 300 angstroms.

After growth of these layers, a positive photoresist (not shown) is coated on the layers. Photolithography and etching are then carried out in a known manner to form stripe-shaped grooves (not shown).

Thereafter, a p-InP electric current blocking layer, an n-InP electric current blocking layer, a p-InP clad layer, and a p-InGaAsP cap layer are formed one-by-one in a known manner to form a double-channel planar buried hetero (DC-PBH) structure.

Further, electrode layers are evaporated onto both surfaces of the DC-PBH structure. The DC-PBH structure is cleaved at a predetermined portion.

Figure 15:
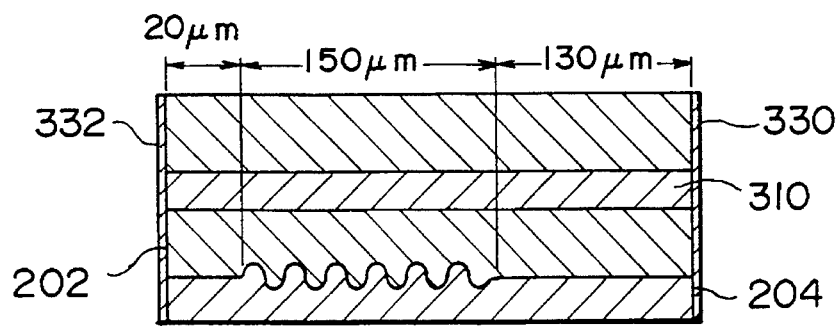
FIG. 15 schematically shows in vertical section a side view of a laser diode element according to the second embodiment of the present invention.

As illustrated in FIG. 15, coating layers 330 are coated on the rear facet 204 to provide a reflectivity of 75% while the additional cladding layers 332 are coated on the front facet 202 to provide a low reflectivity. The coating layers 330 are composed of SiN. Thereafter, the cleaved DC-PBH wafer is scribed or cut along the width direction into a plurality of the laser diode elements.

Under these circumstances, characteristics of each of the laser diode elements were investigated and estimated. Consequently, it was found that the laser diode element oscillates with a wavelength of 1.31 microns.

In order to estimate intermodulation distortion characteristics of the laser diode element, the laser diode element was assembled into a module so that $IMD_3$ of the laser diode element could be measured. As a result, the value of the abovementioned $IMD_3$ was −85 dBc under conditions such that the average light output power is 5 mW and the optical modulation index is 20%.

In order to investigate the merit of this invention, a conventional laser diode element was fabricated as a comparative example. In this example, the value of the $IMD_3$ was −78 dBc under the same conditions.

Thus, it has been confirmed that the laser diode element according to the embodiment of the present invention has excellent intermodulation distortion characteristics.

In this case, the yield, is defined as the percentage of laser diode elements in which a value of the above-mentioned $IMD_3$ is smaller than −80 dBc, was 18% in the laser diode element according to the embodiment of the present invention, while the yield was about 12% in the conventional laser diode elements.

Figure 16A:
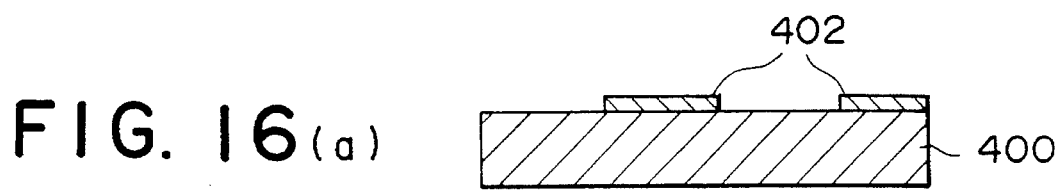
FIGS. 16(a) through (d) show in schematic vertical sections a laser diode element during progress of a method of manufacturing the laser diode element according to the third embodiment of the present invention.
Figure 16B:
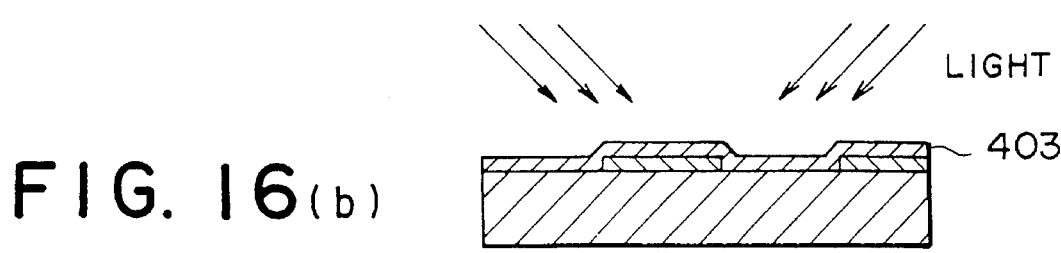
Figure 16C:
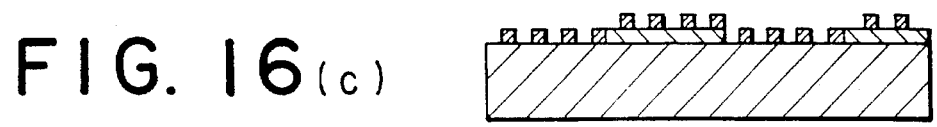
Figure 16D:
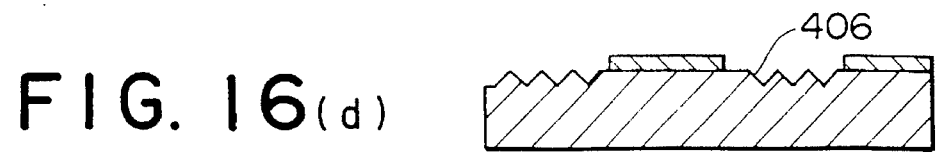
Figure 17:
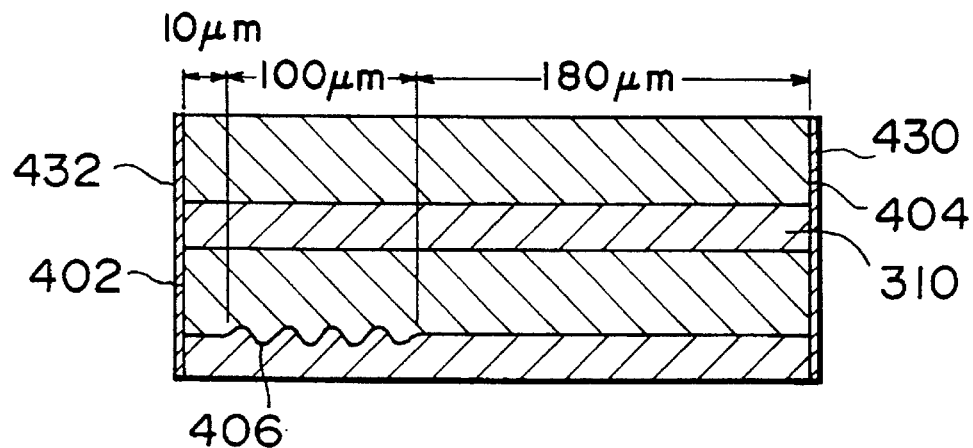
FIG. 17 schematically shows in vertical section a side view of a laser diode element according to the third embodiment of the present invention.
Figure 18:
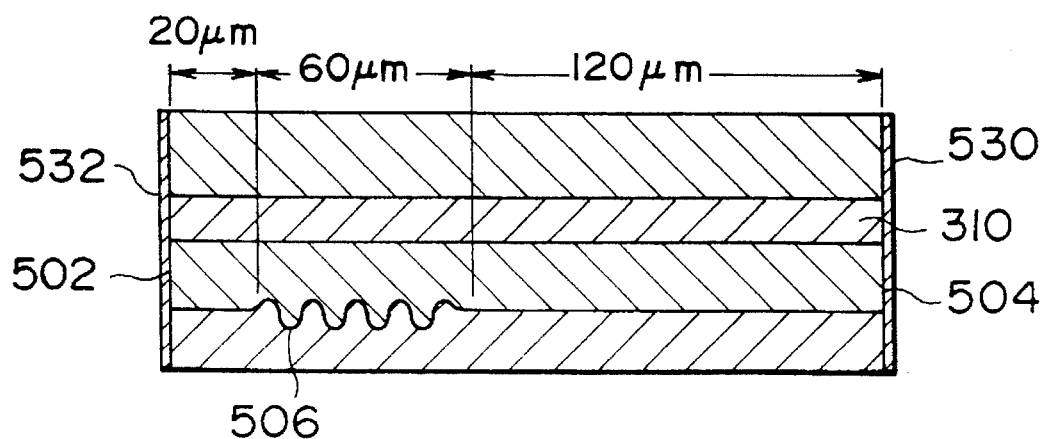
FIG. 18 schematically shows in vertical section a side view of a laser diode element according to the third embodiment of the present invention.

Referring now to FIGS. 16 through 18, description will proceed to a method of manufacturing the above-mentioned laser diode element according to the third embodiment of the present invention. The method according to the third embodiment has steps similar to those of the above-mentioned second embodiment except for the following points.

In this embodiment, after a semiconductor substrate 400 is prepared in a known manner, insulating layers 402 of $SiO_2$ are formed on the semiconductor substrate 400, as shown in FIG. 16(a). The depth of the partial grating 406 is made so that a coupling constant in the partial grating 406 may be 30 cm$^{-1}$. After the partial grating 406 is formed, the insulating layers 402 of $SiO_2$, as well as the photoresist 403, are removed from the semiconductor substrate 400. Further, as illustrated in FIG. 17, coating layers 430 are coated on the rear facet 404 to provide a reflectivity of 90%, while the additional coating layers 432 are coated on the front facet 402 to provide a reflectivity of 1%.

With this method, the above-defined yield was found to be 20%. Insulating layers 402 of $SiO_2$ may alternatively be replaced with insulating layers of $Si_3N_4$.

Other laser diode elements according to a modification of the third embodiment were also fabricated.

As illustrated in FIG. 18, the laser diode element has a partial grating 506 having a length of 60 microns. The length of the laser cavity is 20 microns. Further, as illustrated in FIG. 18, coating layers 530 are coated on the rear facet 504 to provide a reflectivity of 98% while the additional coating layers 532 are coated on the front facet 502 to provide a reflectivity of 0.1%.

In this case, the above-defined yield was about 22%.

Figure 19:
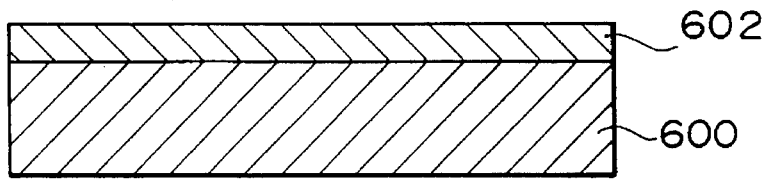
FIGS. 19(a) through (d) show in schematic vertical sections a laser diode element during progress of a method of manufacturing the laser diode element according to the fourth embodiment of the present invention.
Figure 19:
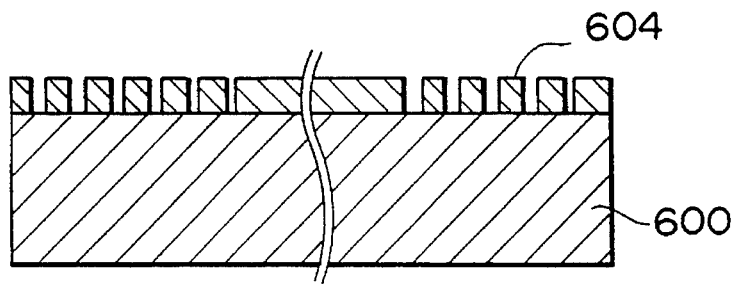
Figure 19:
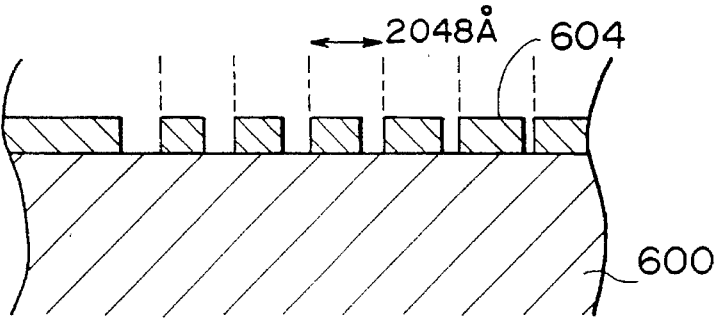
Figure 19:
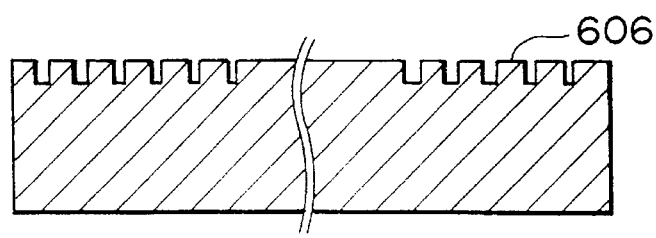
Figure 20:
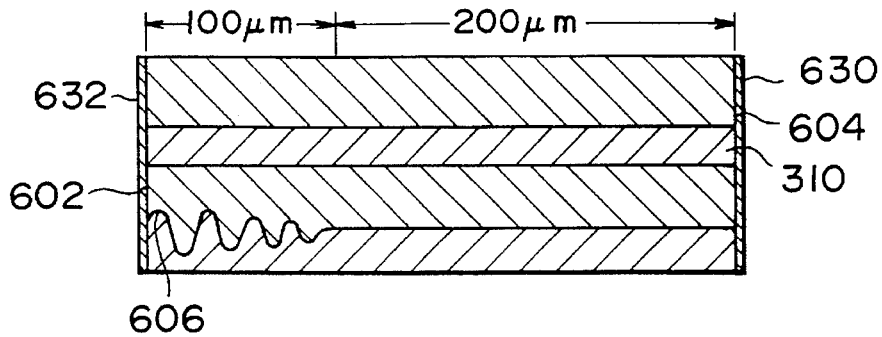
FIGS. 20 schematically shows in vertical section a side view of a laser diode element according to the fourth embodiment of the present invention.

Referring now to FIGS. 19 and 20, description will proceed to a method of manufacturing the abovementioned laser diode element according to the fourth embodiment of the present invention. The method according to the fourth embodiment has steps similar to those of the above-mentioned second embodiment except for the following points.

In this embodiment, after an InP substrate 600 is prepared in a known manner, a resist layer 602 for electron beam exposure is coated in the InP substrate 600, as shown in FIG. 19(a). By electron beam exposure or lithography, a predetermined pattern 604 is formed on the substrate 600 for partially making the grating, as illustrated in FIG. 19(b). The predetermined pattern 604 is enlarged in FIG. 19(c) merely for the better understanding thereof. The pattern 604 has a period of 2048 angstroms. The ratio of exposed area to non-exposed area in each period changes gradually from 1:1 to 1:10. The substrate 600 is etched to form a partial grating 606, as illustrated in FIG. 19(d), by using the predetermined pattern 604 as an etching mask.

Further, as illustrated in FIG. 20, coating layers 630 are coated on the rear facet 604 to provide a reflectivity of 75% while the additional coating layers 632 are coated on the front facet 602 to provide a reflectivity of 1%. As illustrated in FIG. 20, the partial grating 606 is kept in contact with the front facet 602 and extends from the front facet 602 to a length of 100 microns. The coupling constant K is larger in the contact side than in the non-contact side. Namely, the coupling constant K is 70 cm$^{-1}$ in the contact side while 30 cm$^{-1}$ in the non-contact side.

A value of the above-mentioned $IMD_3$ of the laser diode element was also measured. As a result, the value of the $IMD_3$ was −85 dBc.

Figure 21:
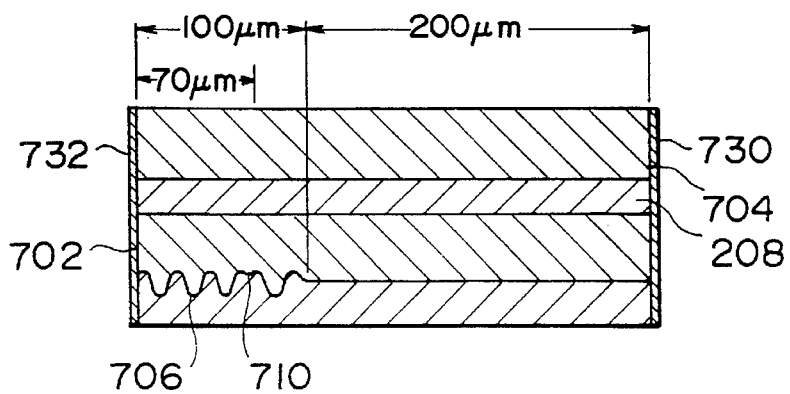
FIG. 21 schematically shows in vertical section a side view of a laser diode element according to the fifth embodiment of the present invention.

Referring to FIG. 21, description will proceed to a laser diode element according to the fifth embodiment of the present invention. The fifth embodiment has a structure similar to that of the above-mentioned second embodiment except for the following points.

In this embodiment, as illustrated in FIG. 21, the partial grating 706 extends from the front facet 702 to a length of 100 microns, like the laser diode element illustrated in FIG. 20, but the coupling constant K of 50 cm$^{-1}$ is uniform from the contact side to the non-contact side. The partial grating 706 has, however, an irregular portion 710 which is operable as a λ/4 phase shift portion. The irregular portion 710 is positioned where the partial grating 706 extends from the front facet 702 by 70 microns.

The value of the above-mentioned $IMD_3$ of this laser diode element was also measured. As a result, the value of the $IMD_3$ was −82 dBc.

Further, an intensity ratio of a main mode oscillation and a sub-mode oscillation was also measured. The intensity ratio was 35 dBc in this embodiment, versus 38 dBc in the conventional laser diode element.

Furthermore, similar effects were achieved in other fabricated laser diode elements, in which the grating includes a phase shift portion falling within a range from $\lambda/8$ to $\lambda/2$.

Thus, characteristics of single mode oscillation are improved in the laser diode element according to this embodiment.

Figure 22:
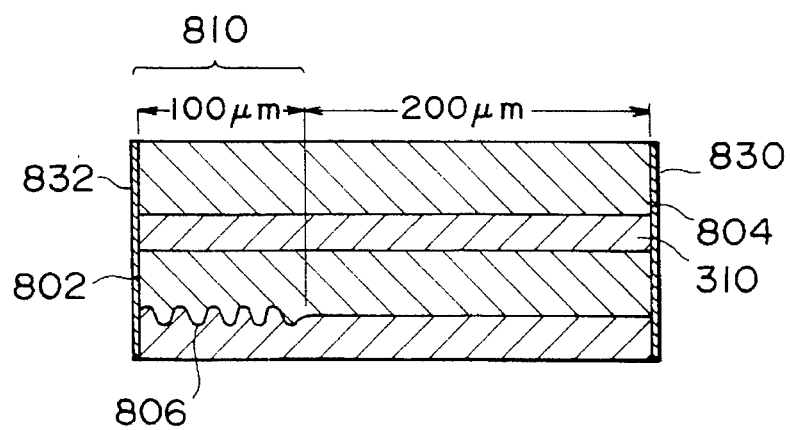
FIG. 22 schematically shows in vertical section a side view of a laser diode element according to the sixth embodiment of the present invention.

Referring to FIG. 22, description will proceed to a laser diode element according to the sixth embodiment of the present invention.

In this embodiment, as illustrated in FIG. 22, the laser diode element has a partial grating 806 which extends from the front facet 802 to a length of 100 microns to make a distributed Bragg reflector region 810.

Further, as illustrated in FIG. 22, coating layers 830 are coated on the rear facet 804 to provide a reflectivity of 75% while the additional coating layers 832 are coated on the front facet 802 to provide a reflectivity of 1%. The partial grating 806 has the coupling constant K of 50 cm$^{-1}$ uniformly from the contact side to the non-contact side.

A value of the above-mentioned $IMD_3$ of the laser diode element was also measured. As a result, the value of the $IMD_3$ was −83 dBc. In addition, the above-defined yield was about 25%.

Moreover, similar effects were achieved in another fabricated laser diode elements, in which the reflectivity of coating layers coated on the rear facet falls within a range from 40% to 98%.

While this invention has thus far been described in conjunction with several embodiments thereof, it will now be readily possible for one skilled in the art to put this invention into effect in various other manners. For example, the active layer is not restricted to have the above-mentioned MQW structure. The active layer may also have a bulk structure.

What is claimed is:

1. A laser diode element comprising:

a semiconductor block having:

a first end surface;

a second end surface opposite to said first end surface;

a laser cavity which is formed between said first and said second end surfaces and which has a predetermined length L;

a plurality of coating layers which are coated on said first end surface to provide a reflectivity smaller than 5%; and an active layer and a uniform grating which are formed in the direction of said laser cavity and which are coupled to each other at a predetermined coupling constant K;

said laser diode element being specified by a product of said predetermined coupling constant K and said predetermined length L and falling within a range between 0.4 and 1.0, both inclusive.

2. A laser diode element as claimed in claim 1, wherein said product of said predetermined coupling constant K and said predetermined length L falls within a range between 0.5 and 0.7, both inclusive.

3. A laser diode element as claimed in claim 2, wherein said reflectivity is not greater than 1%.

4. A laser diode element as claimed in claim 3, further comprising a plurality of additional coating layers which are coated on said second end surface to provide a reflectivity not smaller than 50%.

5. A laser diode element as claimed in claim 3, further comprising a plurality of additional coating layers which are coated on said second end surface to provide a reflectivity not smaller than 90%.

6. A laser diode element as claimed in claim 2, further comprising a plurality of additional coating layers which are coated on said second end surface to provide a reflectivity not smaller than 50%.

7. A laser diode element as claimed in claim 2, further comprising a plurality of additional coating layers which are coated on said second end surface to provide a reflectivity not smaller than 90%.

8. A laser diode element as claimed in claim 1, wherein said reflectivity is not greater than 1%.

9. A laser diode element as claimed in claim 8, further comprising a plurality of additional coating layers which are coated on said second end surface to provide a reflectivity not smaller than 50%.

10. A laser diode element as claimed in claim 8, further comprising a plurality of additional coating layers which are coated on said second end surface to provide a reflectivity not smaller than 90%.

11. A laser diode element as claimed in claim 1, further comprising a plurality of additional coating layers which are coated on said second end surface to provide a reflectivity not smaller than 50%.

12. A laser diode element as claimed in claim 1, further comprising a plurality of additional coating layers which are coated on said second end surface to provide a reflectivity not smaller than 90%.

* * * * *

UNITED STATES PATENT AND TRADEMARK OFFICE
CERTIFICATE OF CORRECTION

PATENT NO.    : 5,469,459
DATED         : November 21, 1995
INVENTOR(S)   : Tetsuro OKUDA, Hirohito YAMADA, Toshitaka TORIKAI It is certified that error(s) appears in the above-identified patent and that said Letters Patent is hereby corrected as shown below:

ABSTRACT, Line 6, delete "layer", insert --laser--.

Col. 7, line 24, delete "24", insert --224--.

Signed and Sealed this

Twentieth Day of August, 1996

Attest:

BRUCE LEHMAN

*Attesting Officer*        *Commissioner of Patents and Trademarks*